United States Patent
Dreps et al.

(10) Patent No.: US 6,546,530 B1
(45) Date of Patent: Apr. 8, 2003

(54) LINEAR DELAY ELEMENT PROVIDING LINEAR DELAY STEPS

(75) Inventors: Daniel Mark Dreps, Georgetown, TX (US); Frank David Ferraiolo, Essex Junction, VT (US); Jing Fang Hao, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 09/662,417

(22) Filed: Sep. 14, 2000

(51) Int. Cl.[7] .............................................. G06F 17/50
(52) U.S. Cl. .......................................... 716/6; 327/278
(58) Field of Search ........................ 326/114; 327/158, 327/278; 716/2, 4, 6

(56) References Cited

U.S. PATENT DOCUMENTS

| | | | | |
|---|---|---|---|---|
| 5,243,227 A | * | 9/1993 | Gutierrez et al. | 326/114 |
| 5,376,849 A | * | 12/1994 | Dickol et al. | 327/278 |
| 6,330,197 B1 | * | 12/2001 | Currin et al. | 327/158 |

* cited by examiner

*Primary Examiner*—Matthew Smith
*Assistant Examiner*—Thuan Do
(74) *Attorney, Agent, or Firm*—Robert A. Voigt, Jr.; Winstead Sechrest & Minick P.C.; Casimer K. Salys

(57) ABSTRACT

A method and circuitry for linearly delaying a signal with linear delay steps. In one embodiment, circuitry in an integrated circuit for linearly delaying a signal comprises a plurality of control signals. The circuitry further comprises a fine delay element coupled to at least one of the plurality of control signals where the fine delay element comprises logic circuitry configured to provide fine adjustments to the delay of the signal. The circuitry further comprises at least one course delay element coupled to the fine delay element where the at least one course delay element is coupled to at least one of the plurality of control signals. Furthermore, the at least one course delay element comprises logic circuitry configured to provide course adjustments to the delay of the signal. The circuitry for linearly delaying a signal is configured to provide testability and programmability. The circuitry for linearly delay a signal is configured to provide linear delay steps. In another embodiment of the present invention, a test signal is coupled to the fine delay element and to the at least one course delay element. The test signal is used to detect faults at the fine delay element and at the at least one course delay element. During the functional mode of this embodiment, power is reduced by disconnecting the test path during the functional mode.

42 Claims, 10 Drawing Sheets

| FIG. 2A | FIG. 2B |

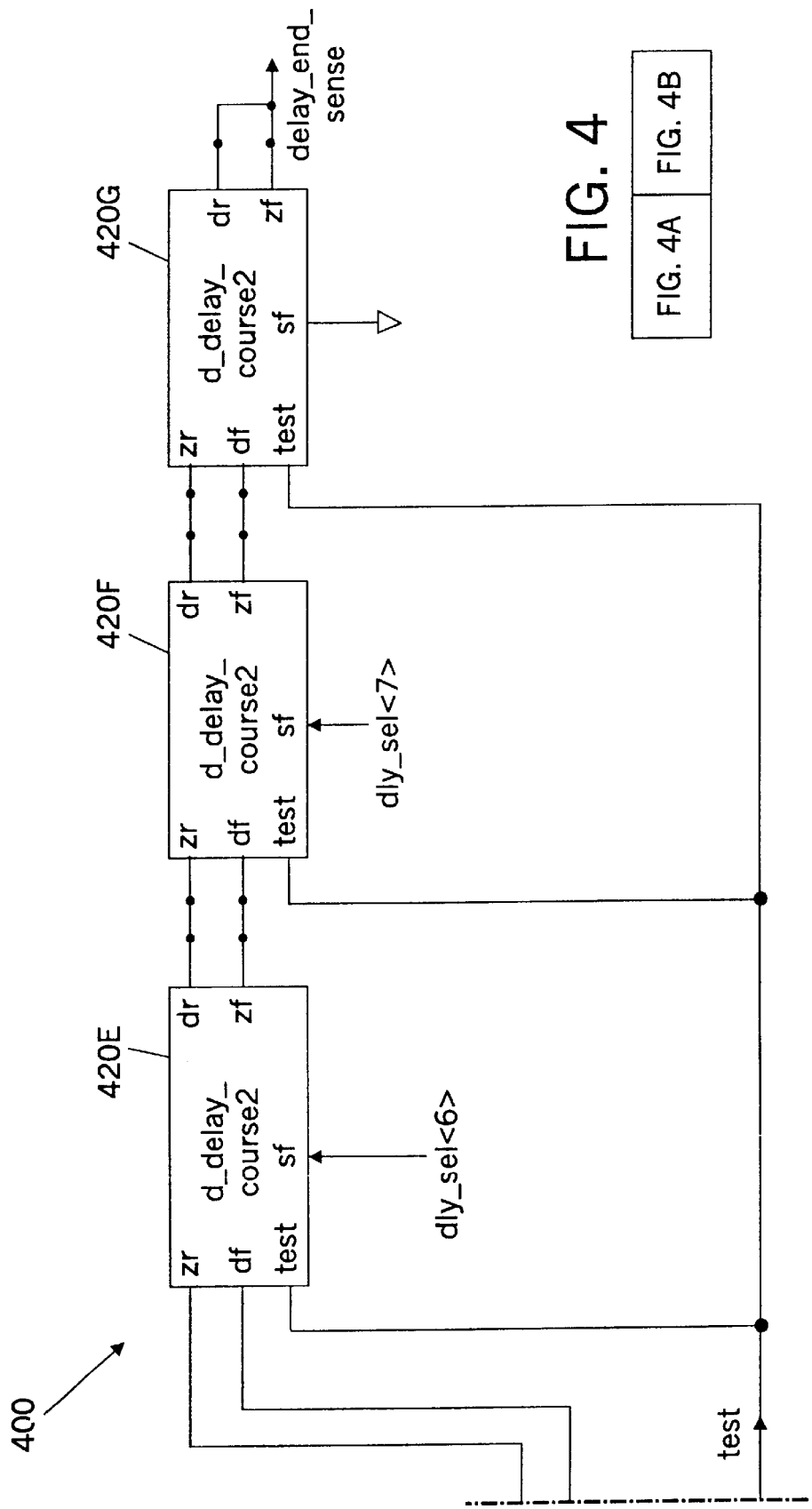

LINEAR DELAY ELEMENT PROVIDING LINEAR DELAY STEPS

CROSS REFERENCE TO RELATED APPLICATIONS

The present invention is related to the following U.S. Patent Application which is incorporated herein by reference:

Ser. No. 09/263,671 entitled "Programmable Delay Element" filed Mar. 5, 1999.

TECHNICAL FIELD

The present invention relates to the field of signal delay devices for integrated circuits, and more particularly to digital delay elements that generate linear steps.

BACKGROUND INFORMATION

Signal delay devices have a function to delay a signal in accordance with an arbitrarily set control signal. For example, integrated circuits generally require delay circuits to compensate for differences in operating speeds of elements so that data does not arrive at a location before the desired time. One method to compensate for differences in operating speeds is to implement a digital delay locked loop ("DLL"). Typically, DLL's have been limited to course variable delays where the incremental delay is one or two logic gates providing one or two block delay units, respectively.

For synchronized interconnects in a digital system, a clocking dictates when a driver circuit places new data on the interconnection line, and when the receiver samples that data at the other end of the line. The main problem with the clocking method is the timing uncertainty problem. There are two types of timing uncertainties. One type of timing uncertainty is the fixed timing uncertainty or skew which is caused by the delay variation between the interconnects. The other type of timing uncertainty is the time-varying uncertainty or jitter which is caused by signal amplitude, power supply noise and temperature variation. The timing uncertainty problem may be solved by having the transmitted data sampled at the time instant during which the data is most unlikely to change. That occurs when the sampling event is at the center of the eye, i.e., middle, of the clock pulse.

Unfortunately, these variable delay devices, e.g., DLL's, have variable incremental delays. By having variable incremental delays, data may not arrive at the eye, i.e., middle, of the clock pulse. When the data does not arrive at the eye of the clock pulse, the data may become skewed and hence decrease the overall performance of the integrated circuit.

It would therefore be desirable to develop a delay device that generates linear delay steps within a certain range to optimize placement of data. It would further be desirable to develop a delay device that has the capability of being tested and programmed while generating linear delay steps. It would further be desirable to develop a linear delay device with reduced power.

SUMMARY

The problems outlined above may at least in part be solved in some embodiments by providing a linear delay element comprising a fine delay element and at least one course delay element where the linear delay element is configured to provide linear delay steps as well as configured to provide testability and programmability. In another embodiment of the present invention, the linear delay element operates with reduced power.

In one embodiment, circuitry in an integrated circuit for linearly delaying a signal comprises a plurality of control signals. The circuitry further comprises a fine delay element coupled to at least one of the plurality of control signals where the fine delay element comprises logic circuitry configured to provide fine adjustments to the delay of the signal. The circuitry further comprises at least one course delay element coupled to the fine delay element where the at least one course delay element is coupled to at least one of the plurality of control signals. Furthermore, the at least one course delay element comprises logic circuitry configured to provide course adjustments to the delay of the signal. The circuitry for linearly delaying a signal is configured to provide both testability and programmability. The circuitry for linearly delay a signal is configured to provide linear delay steps.

In another embodiment of the present invention, a test signal is coupled to the fine delay element and to the at least one course delay element. The test signal is used to detect faults at the fine delay element and at the at least one course delay element. During the functional mode of this embodiment, power is reduced by disconnecting the test path during the functional mode.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

The present invention comprises circuitry and a method for linearly delaying a signal. In one embodiment of the present invention, circuitry in an integrated circuit comprises a plurality of control signals. The circuitry further comprises a fine delay element coupled to at least one of the plurality of control signals where the fine delay element comprises logic circuitry configured to provide fine adjustments to the delay of the signal. The circuitry further comprises at least one course delay element coupled to the fine delay element where the at least one course delay element is coupled to at least one of the plurality of control signals. The at least one course delay element comprises logic circuitry configured to provide course adjustments to the delay of the signal. The fine delay element and the at least one course delay element are configured to provide testability and programmability. Furthermore, the fine delay element and the at least one course delay element are configured to provide linear delay steps. In another embodiment of the present invention, a test signal is coupled to the fine delay element and to the at least one course delay element. The test signal is used to detect faults at the fine delay element and at the at least one course delay element. During the functional mode of this embodiment, power is reduced by disconnecting the test path during the functional mode.

In the following description, numerous specific details are set forth to provide a thorough understanding of the present invention. It should be noted, however, that those skilled in the art are capable of practicing the present invention without such specific details. In other instances, well-known circuits have been shown in block diagram form in order not to obscure the present invention in unnecessary detail.

Although the present invention is described with reference to specific embodiments of a linear delay element providing a linear delay step in response to a selected input, it should be understood that the linear delay element of the present invention can be adapted for use with other digital devices having comparable hardware capabilities, and selective circuitry including, by way of example, other combinations of logic circuitry such as transmission gates, inverters, dummy loads and logic gates, having sufficient bandwidth for high-performance computer operations at high-speed clock rates in the gigahertz range, and have the ability to provide a selective linear delay steps in a certain range while providing testing and programming capability. Furthermore, the linear delay element of the present invention can be adaptable to both on-chip and off-chip delay circuitry in a computer system. A chip refers to the thousands or millions of transistors packed in a small piece of semiconductor substrate that are wired together to perform a specific function. All such variations are intended to be included within the scope of the present invention.

Figure 1:
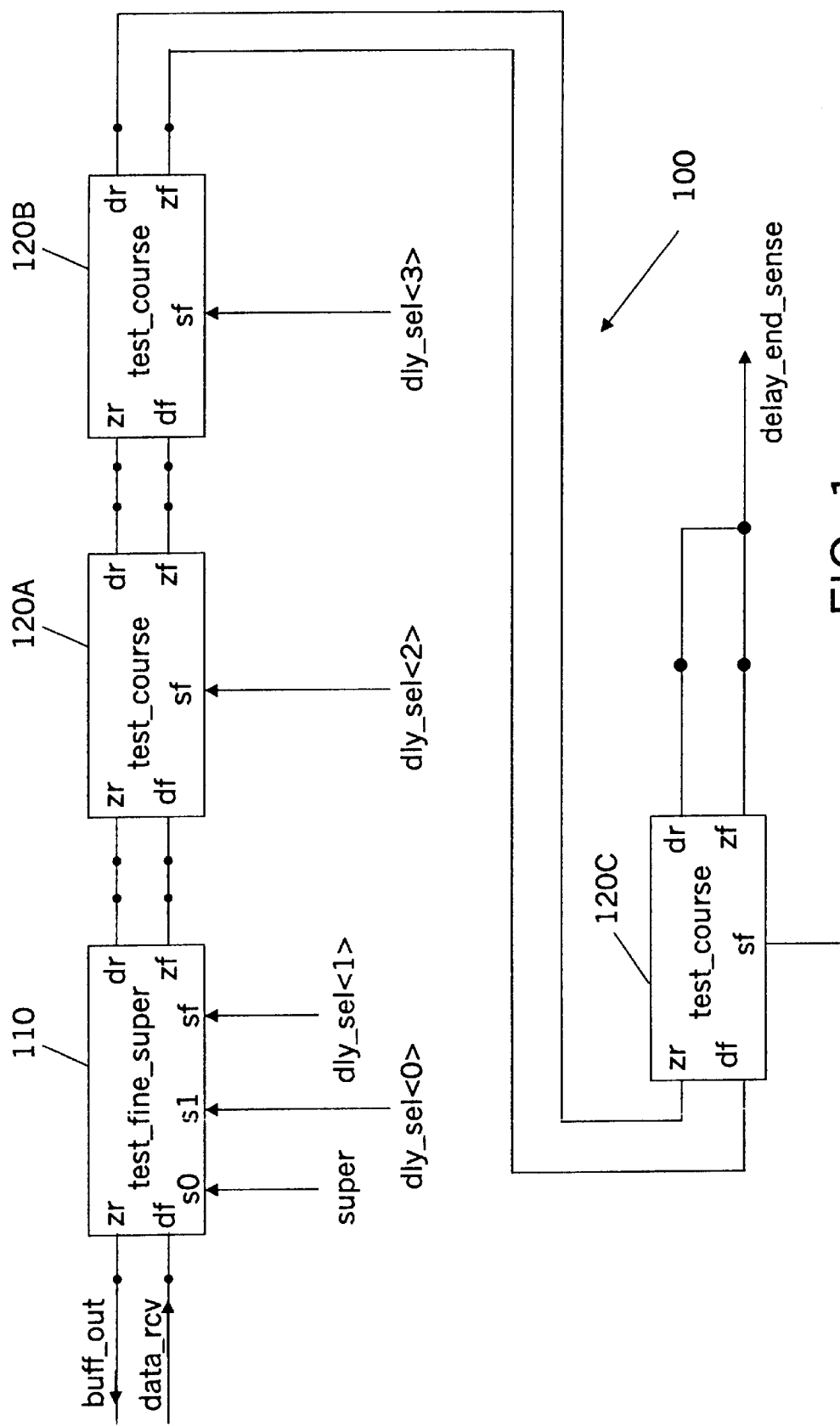
FIG. 1 illustrates a block diagram of an embodiment of the present invention of a linear delay element linearly delaying a signal with testing and programming capability.

FIG. 1—Block Diagram of an Embodiment of a Linear Delay Element with Testing and Programming Capability FIG. 1 illustrates a block diagram of an embodiment of a linear delay element 100 with testing and programming capability. Linear delay element 100 comprises a fine delay element 110 coupled to a plurality of course delay elements 120A–C. Course delay elements 120A–C may collectively or individually be referred to as course delay elements 120 or course delay element 120, respectively. It is noted that linear delay element 100 may comprise only one course delay element 120. It is further noted that linear delay element 100 may comprise any number of course delay elements 120 and that FIG. 1 is used for illustrative purposes.

Fine delay element 110 is coupled to an input signal, i.e., data_rcv, at input terminal df. Fine delay element 110 is further coupled to a plurality of control signals, e.g., super, dly_sel<0>, dly_sel<1> at terminals s0, s1, sf, respectively. These control signals determine the selected propagation path of the input signal and hence the amount of the delay of the input signal, i.e., data_rcv. A further explanation of the relationship between the control signals and the linear delay of the input signal will be provided in the detailed description of FIG. 3.

Fine delay element 110 is further coupled to course delay element 120A at output terminals zf and dr. The input signal may be propagated from fine delay element 110 to course delay element 120A through output terminal zf of fine delay element 110 upon selection of dly_sel<1>. The assertion of dly_sel<1> provides for the input signal to be propagated from fine delay element 110 to the adjacent delay element, e.g., course delay element 120A. Fine delay element 110 may receive the signal being propagated from course delay element 120A to fine delay element 110 through output terminal dr of fine delay element 110. Upon completion of the selected propagation path of the input signal, the input signal is outputted of fine delay element 110 at input terminal zr. The output signal is labeled buff_out in FIG. 1.

Figure 2A:
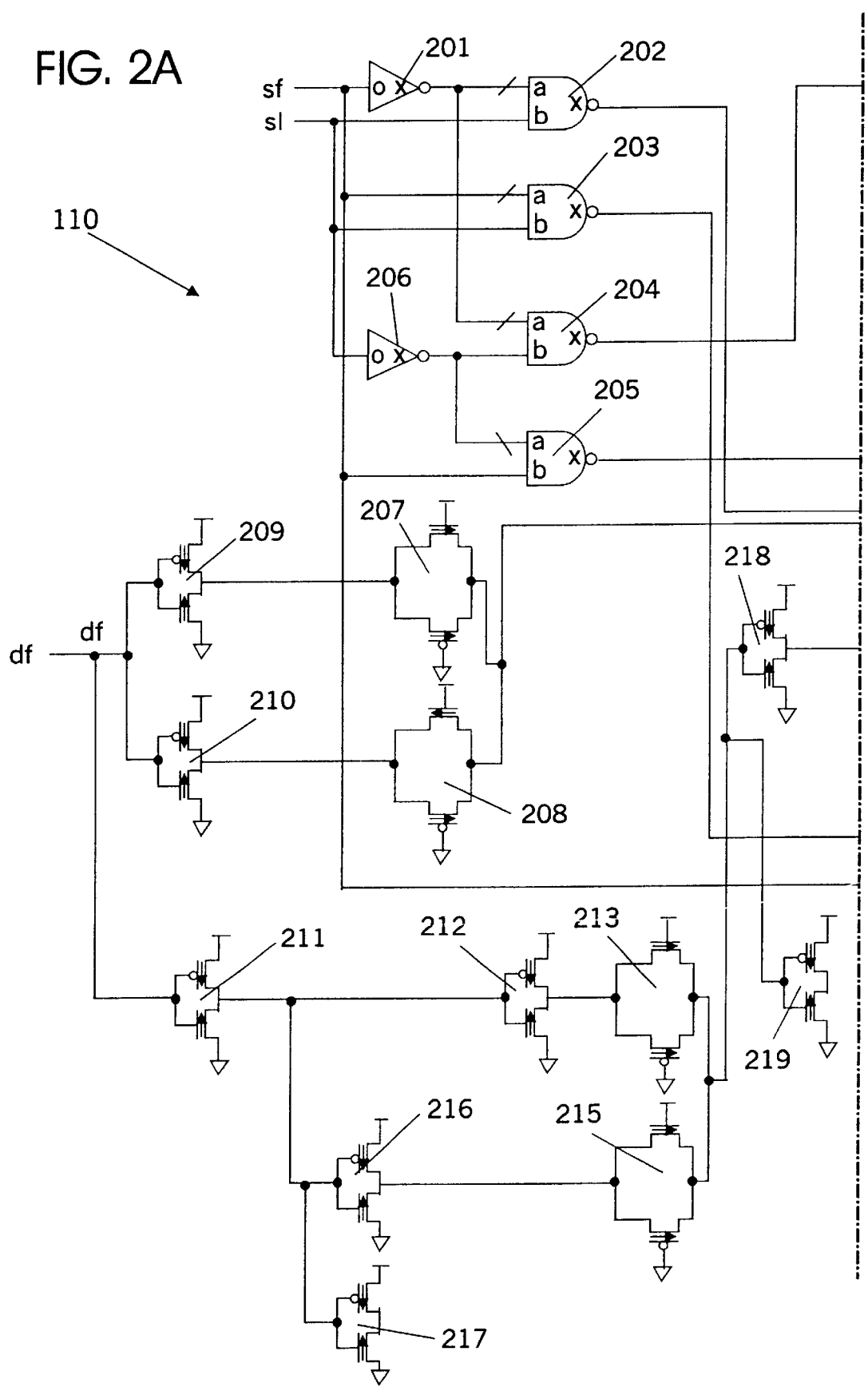
FIG. 2 illustrates an embodiment of the present invention of a fine delay element linearly delaying a signal with testing and programming capability.
Figures 2, 2B:
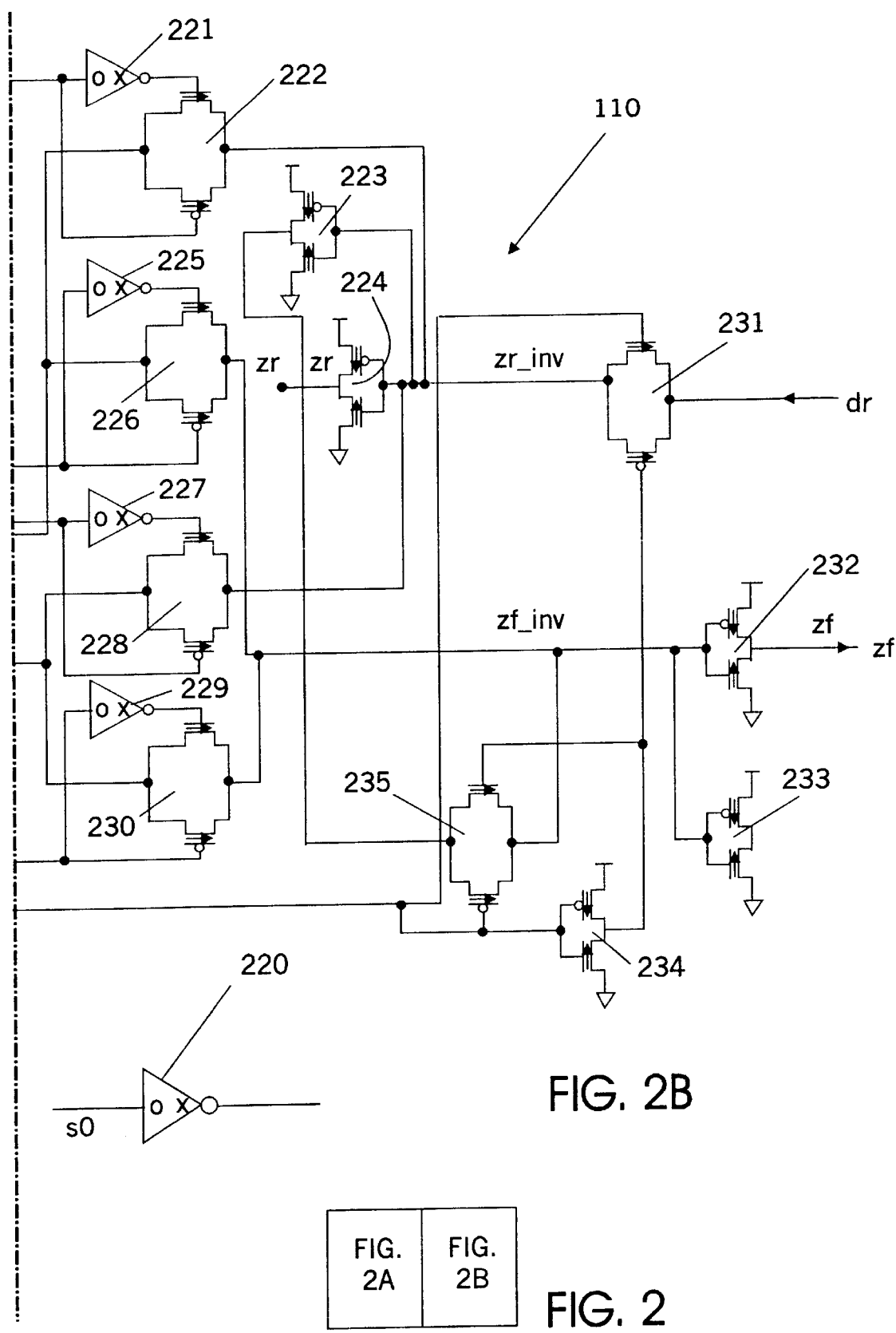

Fine delay element 110 is configured to provide fine adjustments to the delay of the input signal. A detailed illustration of one embodiment of the logic circuitry of fine delay element 110 that provides fine adjustments to the input signal is shown in FIG. 2.

Every course delay element 120 except the last course delay element 120 in the delay line, e.g., 120C, is coupled to a unique control signal. For example, course delay element 120A is coupled to control signal dly_sel<2> at terminal sf. Course delay element 120B is coupled to control signal dly_sel<3> at terminal sf. It is noted that in embodiments where there is only one course delay element 120 there is no unique control signal coupled to that one course delay element 120. It is further noted that in other embodiments, course delay elements 120 may be coupled to more than one control signal. These control signals, e.g., dly_sel<2>, dly_sel<3>, determine whether course delay element 120 with the respective control signal, e.g., 120A and 120B, provides for the input signal to be propagated to the adjacent delay element, e.g., 120B and 120C. A further explanation of the relationship between the control signals and the propagation of the input signal will be provided in the detailed description of FIG. 3.

Course delay element 120A is coupled to course delay element 120B through output terminal zf and dr. The input signal may be propagated from course delay element 120A to the next course delay element, e.g., 120B, through output terminal zf upon selection of control signal dly_sel<2>. The input signal may then return from course delay element 120B to course delay element 120A through output terminal dr of course delay element 120A. The input signal may then be outputted of course delay element 120A at input terminal zr to output terminal dr of the previous delay element, i.e., fine delay element 110.

Course delay element 120B is coupled to course delay element 120C through output terminal zf and dr. The input signal may be propagated from course delay element 120B to the next course delay element, e.g., 120C, through output terminal zf upon selection of control signal dly_sel<3>. The input signal may then return from course delay element 120C to course delay element 120B through output terminal dr of course delay element 120B. The input signal may then be outputted of course delay element 120B at input terminal zr to output terminal dr of the previous delay element, i.e., course delay element 120A.

The last course delay element, e.g., course delay element 120C, is tested at its output terminals dr and zf, i.e., delay_end_sense, to determine faults in any of the delay elements, e.g., fine delay element 110 and course delay element(s) 120. A particular type default detected is commonly referred to as a stuck at fault which occurs when a control signal is stuck at a particular state. Course delay element 120C is coupled to course delay element 120B through input terminals zr and df. Input terminal df receives the input signal from course delay element 120B upon selection of control signal dly_sel<3>. Input terminal zr is used to output the input signal to the previous delay element, i.e., course delay element 120B.

Figure 3:
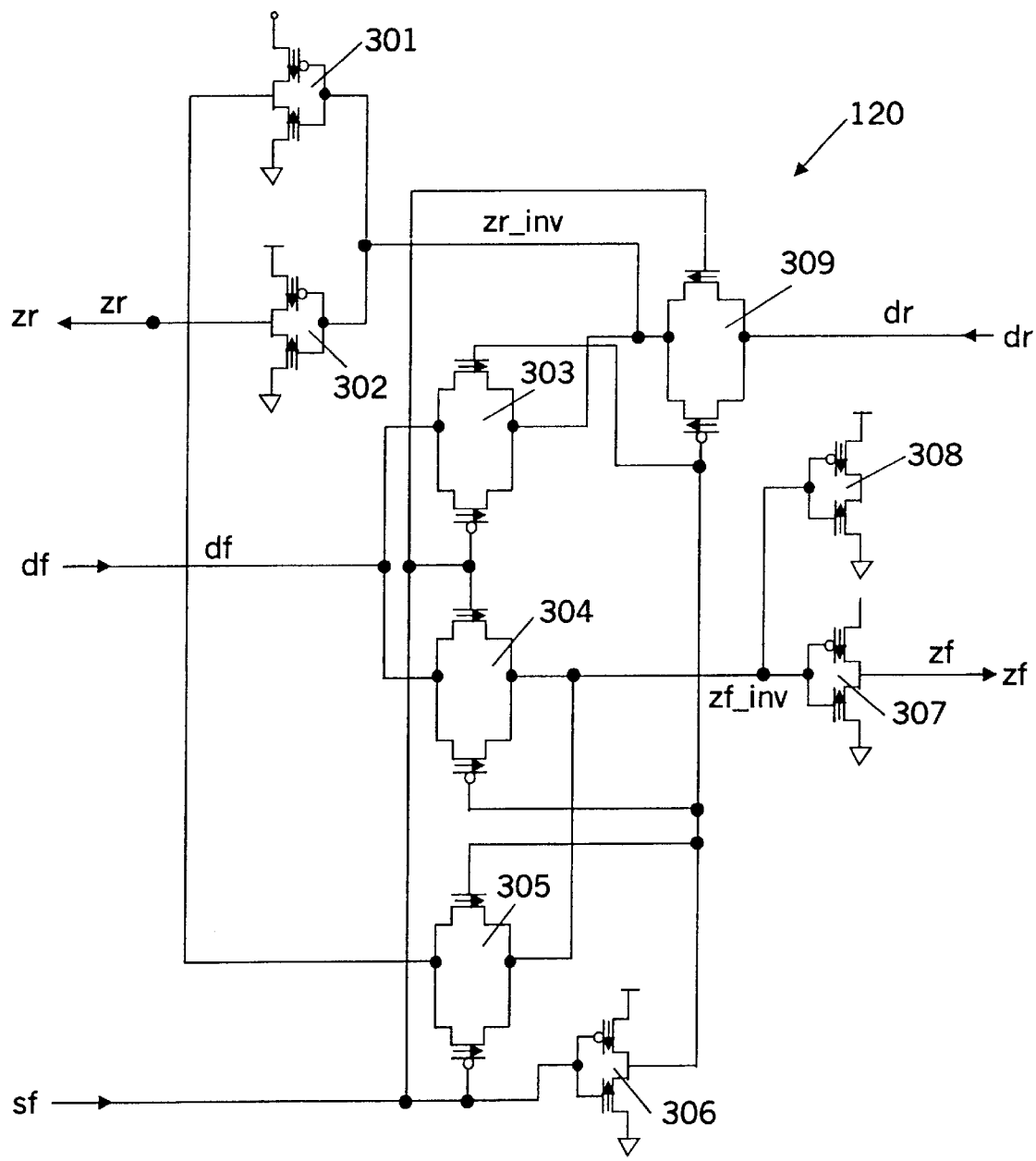
FIG. 3 illustrates an embodiment of the present invention of a course delay element linearly delaying a signal with testing and programming capability.

Course delay elements 120 are configured to provide course adjustments to the delay of the input signal. A detailed illustration of one embodiment of course delay elements 120 that provide course adjustments to the input signal is shown in FIG. 3.

FIG. 2—Embodiment of a Fine Delay Element Linearly Delaying a Signal

FIG. 2 illustrates an embodiment of a fine delay element 120 that is testable and programmable where an input signal is linearly delayed. Fine delay element 120 comprises a plurality of transmission gates, e.g., 207, 208, 213, 222, 226, 228, 230, 231 and 235. A transmission gate refers to two transistors of opposite types, e.g., p-type and n-type, coupled to one another. Fine delay element 110 further comprises a plurality of inverters, e.g., 201, 206, 209, 210, 211, 212, 215, 216, 218, 219, 220, 221, 223, 224, 725, 227, 229, 232 and 234. Fine delay element 110 further comprises a plurality of dummy loads, e.g., 217, 219, 233. Dummy loads are used to adjust the initial linear delay and linear delay steps, i.e., incremental linear delay of the input signal upon assertion of different control signals. Fine delay element 110 further comprises a plurality of logic gates, e.g., 202, 203, 204 and 205. It is noted that fine delay element 110 may comprise any number of transmission gates, inverters, dummy loads and logic gates. It is further noted that there are other embodiments of fine delay element 110 where fine adjustments are applied to the delay of the input signal. A further explanation of the operation of fine delay element 110 and the initial linear delay and linear delay steps are provided in the detailed description of FIG. 3.

Referring to FIG. 2, inverters 223 and 224, perform two unique functions. Inverter 224 drives the data path, zr, independent of the operation of a test path. That is, the propagation delay across inverter 224 is not affected by whether transmission gate 235 is activated or not. Inverter 223 connects the test path. The test path is used to detect faults at fine delay element 110 and course delay element(s) 120 (FIG. 1). By implementing two separate inverters performing these two functions separately, the amount of the initial delay and the amount of the incremental delay, i.e., delay step, may be adjusted by adjusting the size of the channel width of 223 without affecting The driveability of the data path. Furthermore, by having two separate inverters performing these two functions separately, fine delay element 110 may implement a linear delay step while being configured to provide testability and programmability.

FIG. 3—Embodiment of a Course Delay Element Linearly Delaying a Signal

FIG. 3 illustrates an embodiment of a course delay element 120 that is testable and programmable where an input signal is linearly delayed. It is noted that course delay elements 120 are identical and therefore the embodiment of FIG. 3 applies to each course delay element 120. Course delay element 120 comprises a plurality of transmission gates, e.g., 303, 304 and 309. Course delay element 120 fisher comprises a plurality of inverters, e.g., 301, 302, 306 and 307. Course delay element 120 further comprises at least one dummy load, e.g., 308. It is noted that course delay element 120 may comprise any number of transmission gates, inverters, dummy loads and logic gales. It is further noted that there are other embodiments of course delay element 120 where course adjustments are applied to the delay of the input signal. A further explanation of the operation of course delay element 120 is provided below.

Referring to FIG. 3, inverters 301 and 302, perform two unique functions. Inverter 302 drives the data path, zr, independent of the operation of a test path. That is, the propagation delay across inverter 302 is not affected by whether transmission gate, 305, is activated or not. Inverter 301 connects the test path. The test path is used to detect faults at fine delay element 110 and course delay element(s) 120. By implementing two separate inverters performing these two functions separately, the amount of the initial delay and the amount of the incremental delay, i.e., delay step, may be adjusted by adjusting the size of the channel width of 301 without affecting the driveability of the data path. Furthermore, by having two separate inverters performing these two functions separately, course delay element 120 may implement a linear delay step while being configured to provide testability and programmability.

The operation of fine delay element 110 (FIGS. 1 and 2) and course delay element 120A (FIG. 1) is described in conjunction with Table 1 shown below. It is noted that the description of the operation of course delay element 120A is applicable to the description of the operations of other course delay elements, e.g., 120B, 120C.

| super | dy_sel<0> | dy_sel<1> | Data Propagation Delay |
|---|---|---|---|
| 0 | 0 | 0 | 100 ps |
| 1 | 0 | 0 | 140 ps |
| 0 | 1 | 0 | 180 ps |
| 1 | 1 | 0 | 220 ps |
| 0 | 0 | 1 | 260 ps |
| 1 | 0 | 1 | 300 ps |
| 0 | 1 | 1 | 340 ps |
| 1 | 1 | 1 | 380 ps |

Table 1 illustrates the selection of various data propagation paths, i.e., paths data is propagated, by a plurality of control signals, i.e., super, dy_sel<0>, dy_sel<1>, for linear delay element 100 having a fine delay element 110 coupled to course delay element 120A. Table 1 illustrates that the delays between the various data propagation paths are linearly incremented, e.g., 40 ps. It is noted that the data propagation times are illustrative. It is further noted that the linear delay steps, i.e., incremental delays, may be any amount of linear incremental delay within a certain range.

In an embodiment of the present invention, the linear delay steps may be adjusted by adjusting the size of at least one channel width of at least one particular inverter in fine delay element 110 and/or course delay element(s) 120. In another embodiment, the linear delay steps may be adjusted by adjusting the size of at least one channel width of at least one particular transmission gate in fine delay element 110 and/or course delay element(s) 120. In another embodiment, the linear delay steps may be adjusting the load of at least one particular dummy load of fine delay element 110 and/or course delay element(s) 120. In another embodiment, the linear delay steps may be adjusted by a combination of adjusting the size of at least one channel width of at least one particular inverter and/or at least one particular transmission gate in fine delay element 110 and/or course delay element(s) and adjusting at least one particular load of at least one dummy load of fine delay element 110 and/or course delay element(s) 120.

Referring to FIG. 3 in conjunction with Table 1 and FIGS. 1–2, when control signal super is 0, i.e., deactivated, and control signals dy_sel<0> and dy_sel<1> are 0, i.e., deactivated, the data propagation delay of the input signal is 100 ps. The data propagation path of the input signal is through devices 209, 210, 208, 207, 222, 224 and outputted through terminal zr. When super is 0, transmission gates 207 and 208 are activated which decreases the overall impedance of transmission gates 207 and 208 and hence decreases the data propagation delay of the input signal. The above described data propagation path is the shortest data propagation path of the input signal of linear delay element 100.

The test path of the input signal when control signal super is 0, i.e., deactivated, and control signals dy_sel<0> and dy_sel<1> are 0, i.e., deactivated, includes the above described data propagation path of the input signal as well as the path through devices 223, 235 and 232. The input signal is then outputted through terminal zf of fine delay 110 and propagated through the remaining course delay element(s) 120 until the input signal is outputted through terminal zf of the last course delay element 120 in the delay line. Once the input signal is outputted at the end of the delay line, the input signal is then sensed to detect faults, e.g., stuck at fault, in any of the delay elements, e.g., fine delay element 110 and course delay element(s) 120, at delay_end_sense.

When control signal super is 1, i.e., activated, and control signals dy_sel<0> and dy_sel<1> are 0, the data propagation delay of the input signal is 140 ps. The data propagation path of the input signal is through devices 209, 207, 222 and 224 and outputted through terminal zr. When super is 1, transmission gate 208 is deactivated which increases the overall impedance of the transmission gates 207 and 208 and hence increases the data propagation delay of the input signal from the previously described case. The above described data propagation path is the second shortest data propagation path of the input signal of linear delay element 100.

The test path of the input signal when control signal super is 1, i.e., activated, and control signals dl_sel<0> and dly_sel<1> are 0, i.e., deactivated, includes the same test path as the case for when all three control signals, super, dly_sel <0>, and dly_sel<1>, are 0 as described above.

When control signal dly_sel<0> is 1 and control signals, super, dly_sel<1> are 0, the data propagation delay of the input signal is 180 ps. The data propagation path of the input signal is through devices 211, 212, 216, 213, 215, 218, 228 and 224 and outputted through terminal zr. The above described data propagation path is the third shortest data propagation path of the input signal of linear delay element 100.

The test path of the input signal when control signal dly_sel<0> is 1 and control signals, super, dly_sel <1> are 0, includes the same test path as the case for when all three control signals, super, dly_sel <0>, and dly_sel<1>, are 0 as described above.

When control signals super and dly_sel<0> are 1 and control signal dly_sel<1> is 0, the data propagation delay of the input signal is 220 ps. The data propagation path of the input signal is through devices 211, 212, 213, 218, 228 and 224 and outputted through terminal zr. The above described data propagation path is the fourth shortest data propagation path of the input signal of linear delay element 100.

The test path of the input signal when control signals super and dly_sel<0> are 1 and control signal dly_sel<1> is 0, includes the same test path as the case for when all three control signals, super, dly_sel <0>, and dly_sel <1>, are 0 as described above.

When control signal dly_sel<1> is 1 and control signals super and dly_sel<0> are 0, the data propagation delay of the input signal is 260 ps. The data propagation path of the input signal is through devices 209, 210, 207, 208, 226 and 232 and outputted through terminal zf of fine delay element 110 to input terminal df of course delay element 120A. The data propagation path of the input signal continues through devices 303 and 302 of course delay element 120A and outputted through input terminal zr of course delay element 120A to output terminal dr of fine delay element 110. The data propagation path of the input signal continues through devices 231 and 224 and outputted through terminal zr of fine delay element 110. The above described data propagation path is the fifth shortest data propagation path of the input signal of linear delay element 100. The above described data propagation path illustrates a data propagation path where the input signal propagates from fine delay element 110 to course delay element 120A and then back to fine delay element 110.

The test path of the input signal when control signal dly_sel<1> is 1 and control signals super and dly_sel<0> are 0, includes a path through devices 209, 210, 208, 207, 226, 232 in fine delay element 110. The input signal is then outputted through terminal zr of fine delay element 110 and inputted through terminal df of course delay element 120A propagating through devices 303, 301, 305, 307 of course delay element 120A. The input signal is then outputted through terminal zf of course delay element 120A and propagated through the remaining course delay element(s) 120 until the input signal is outputted through terminal zf of the last course delay element 120 in the delay line. Once the input signal is outputted at the end of delay line, the input signal is then sensed to detect faults, e.g., stuck at fault, in any of the delay elements, e.g., fine delay element 110 and course delay element(s) 120, at delay_end_sense.

When control signals super and dly_sel<1> are 1 and control signal dly_sel<0> is 0, the data propagation delay of the input signal is 300 ps. The data propagation path of the input signal is through devices 209, 207, 226 and 232 and outputted through terminal zf of fine delay element 110 to input terminal df of course delay element 120A. The data propagation path of the input signal continues through devices 303 and 302 and outputted through input terminal zr of course delay element 120A to output terminal dr of fine delay element 110. The data propagation path of the input signal continues through devices 231 and 224 and outputted through terminal zr of fine delay element 110. The above described propagation path is the sixth shortest data propagation path of the input signal of linear delay element 100. The above described propagation path illustrates a data propagation path where the input signal propagates from fine delay element 110 to course delay element 120A and then back to fine delay element 110.

The test path of the input signal when control signals super and dly_sel<1 > are 1 and control signal dly_sel<0>is 0, includes the same test path as the case for when control signal dly_sel<1> is 1 and control signals super and dly_sel<0> are 0 as described above.

When control signals super and dly_sel<1> are 1 and control signal dly_sel<0> is 0, the data propagation delay of the input signal is 340 ps. The data propagation path of the input signal is through devices 211, 216, 217, 212, 213, 215 218, 230, 233 and 232 and outputted through terminal zf of fine delay element 110 to input terminal df of course delay element 120A. The data propagation path of the input signal continues through devices 303 and 302 and outputted through input terminal zr of course delay element 120A to output terminal dr of fine delay element 110. The data propagation path of the input signal continues through devices 231 and 224 and outputted through terminal zr of fine delay element 110. The above described data propagation path is the seventh shortest data propagation path of the input signal of linear delay element 100. The above described propagation path illustrates a data propagation path where the input signal propagates from fine delay element 110 to course delay element 120A and then back to fine delay element 100.

The test path of the input signal when control signals super and dly_sel<1> are 1 and control signal dly_sel<0> is 0, includes a path through devices 211, 216, 217, 212, 213, 215, 218, 230, 233 and 232 in fine delay element 110. The input signal is then outputted through terminal zr of fine delay element 110 and inputted through terminal df of course delay element 120A propagating through devices 303, 301, 305, 307 of course delay element 120A. The input signal is then outputted through terminal zf of course delay element 120A and propagated through the remaining course delay element(s) 120 until the input signal is outputted through terminal zf of the last course delay element 120 in the delay line. Once the input signal is outputted at the end of delay line, the input signal is then sensed to detect faults, e.g., stuck at fault, in any of the delay elements, e.g., fine delay element 110 and course delay element(s) 120, at delay_end_sense.

When control signals super, dly_sel<1> and dly_sel<0> are 1, the data propagation delay of the input signal is 380 ps. The data propagation path of the input signal is through devices 211, 212, 213, 218, 230 and 232 and outputted through terminal zf of fine delay element 110 to input terminal df of course delay element 120A. The data propagation path of the input signal continues through devices 303 and 302 and outputted through input terminal zr of course delay element 120A to output terminal dr of fine delay element 110. The data propagation path of the input signal continues through devices 231 and 224 and outputted through terminal zr of fine delay element 110. The above described data propagation path is the eighth shortest data propagation path of the input signal of linear delay element 100. The above described propagation path illustrates a data propagation path where the input signal propagates from fine delay element 110 to course delay element 120A and then back to fine delay element 110.

The test path of the input signal when control signals super, dly_sel<0> and dly_sel<1> are 1, includes the same test path as the case for when control signals super and dly_sel<1> is 1 and control signal dly_sel<0> is 0 as described above.

Figure 4A:
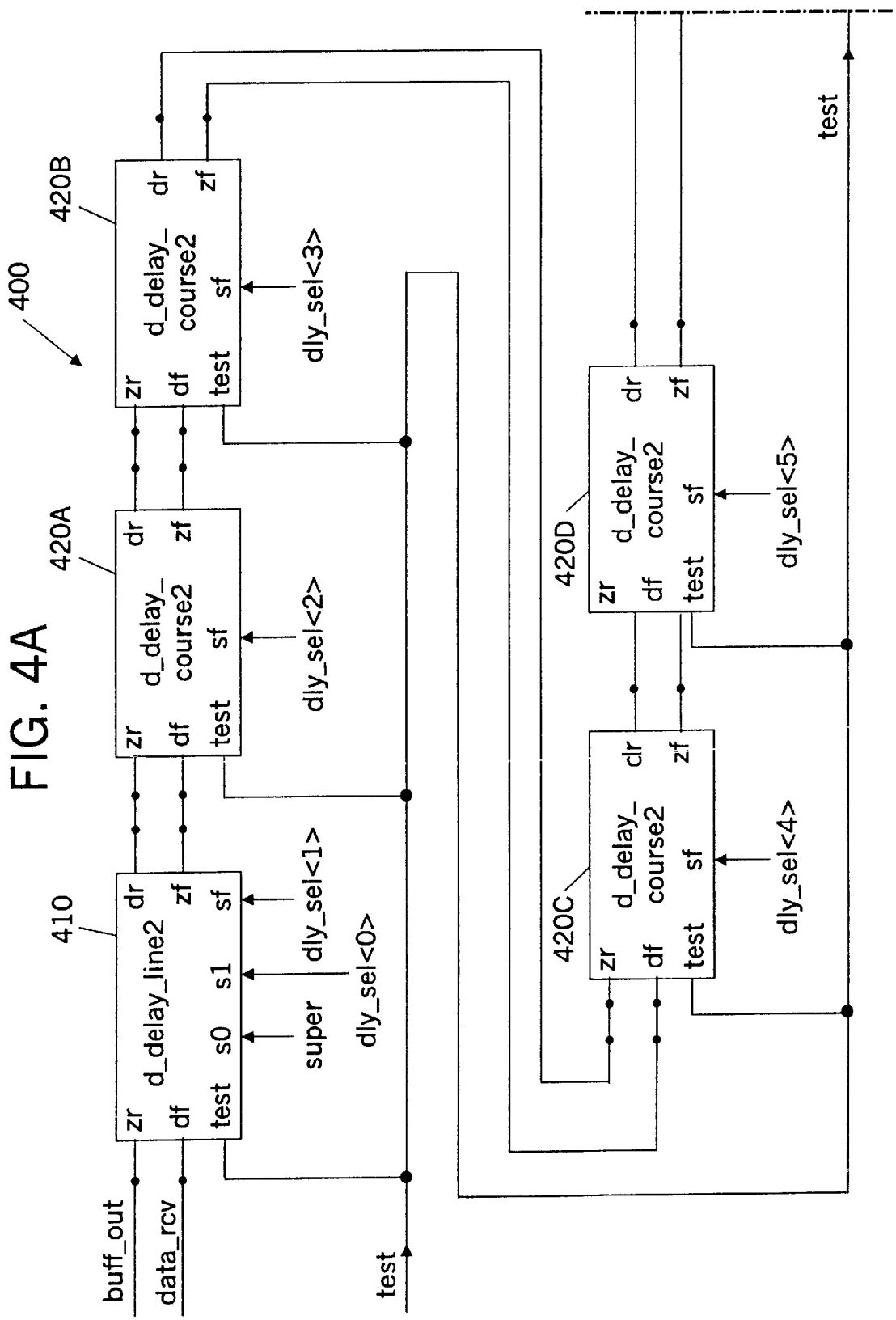
FIG. 4 illustrates a block diagram of another embodiment of the present invention of a linear delay element linearly delaying a signal with testing and programming capability.

FIG. 4—Block Diagram of Another Embodiment of a Linear Delay Element with Testing and Programming Capability FIG. 4 illustrates a block diagram of an embodiment of a linear delay element 400 with testing and programming capability. Linear delay element 400 comprises a fine delay element 410 coupled to a plurality of course delay elements 420A–G. Course delay elements 420A–G may collectively or individually be referred to as course delay elements 420 or course delay element 420, respectively. It is noted that other embodiments of the present invention may comprise only one course delay element 420. It is further noted that linear delay element 100 may comprise any number of course delay elements 420 and that FIG. 4 is used for illustrative purposes.

Linear delay element 400 differs from linear delay element 100 by having a test signal inputted to fine delay element 410 and to each course delay element 420. The test signal is used to detect faults at fine delay element 410 and course delay element(s) 420. By having fine delay element 410 and course delay element(s) 420 coupled to a test signal, linear delay element 400 operates with less power than linear delay element 100 as discussed in the detailed descriptions of FIGS. 5 and 6. Furthermore, fine delay element 410 does not receive control signal super. It is noted that in other embodiments, fine delay element 410 may receive control signal super. It is noted that all other aspects of linear delay element 400 are identical to linear delay element 100. A detailed explanation as to the functional differences between linear delay element 400 and linear delay element 100 is provided below in the detailed descriptions of FIGS. 5 and 6.

Figure 5A:
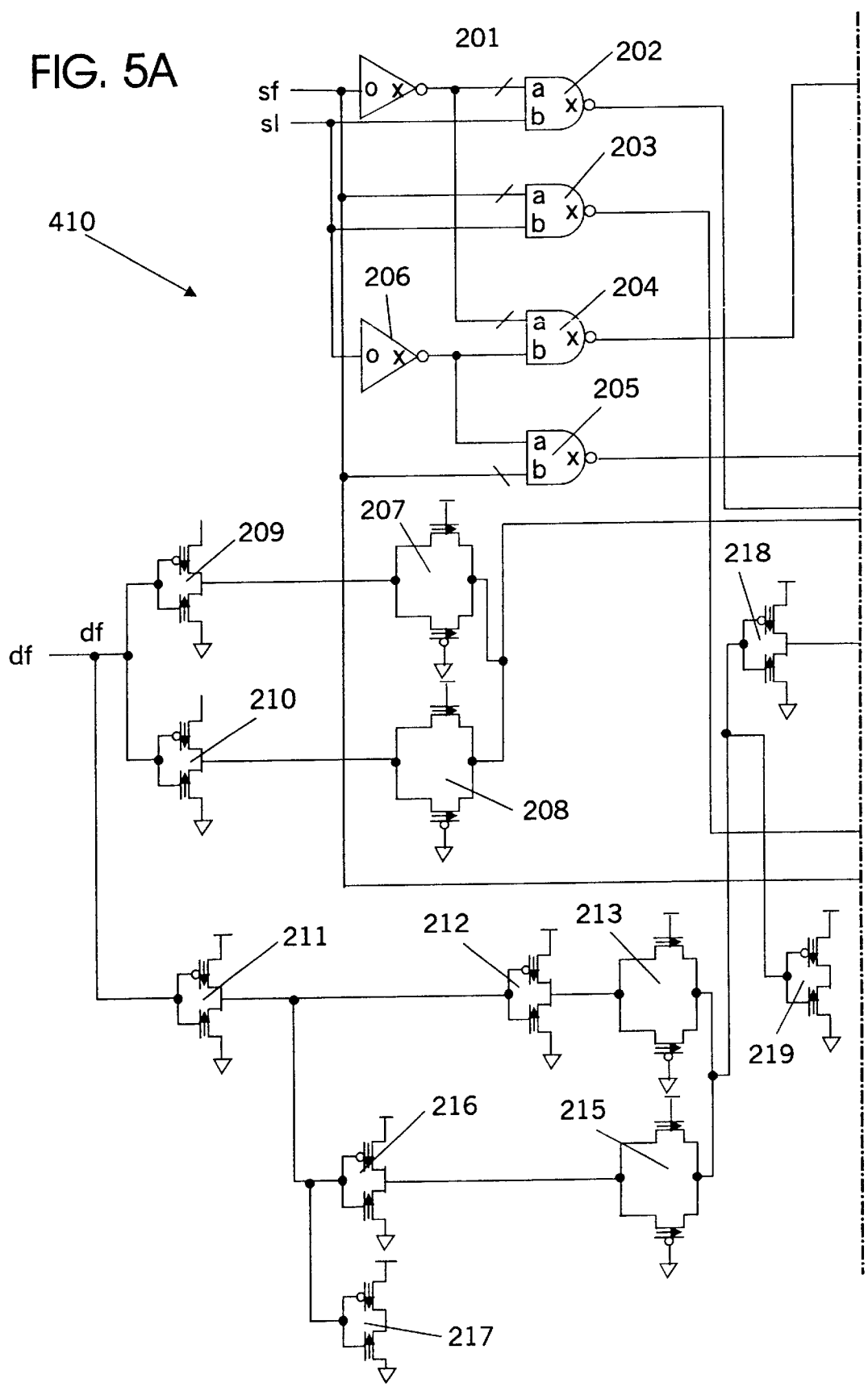
FIG. 5 illustrates another embodiment of the present invention of a fine delay element linearly delaying a signal with testing and programming capability.
Figures 5, 5B:
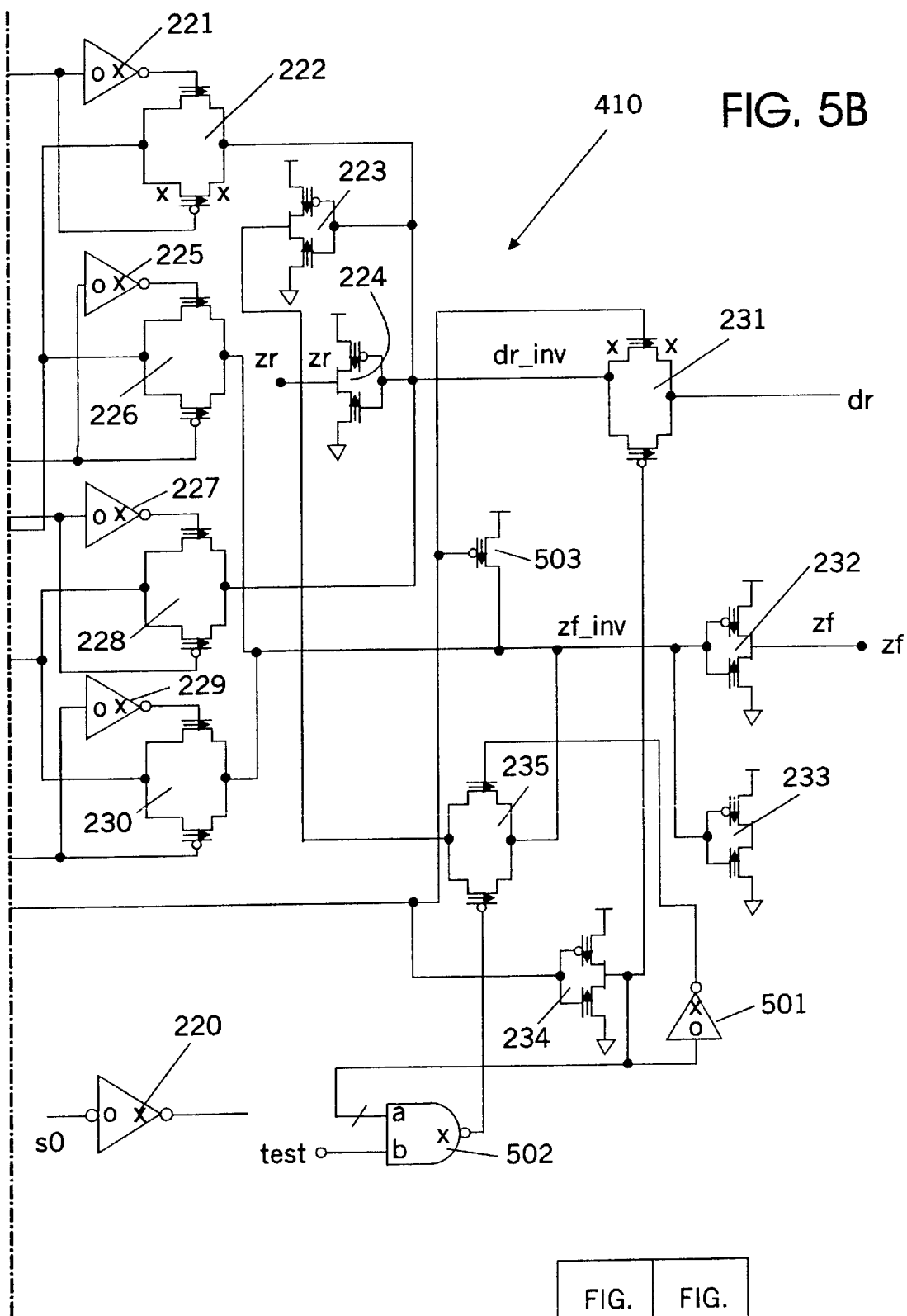

FIG. 5—Another Embodiment of a Fine Delay Element Linearly Delaying a Signal

FIG. 5 illustrates an embodiment of fine delay element 410 (FIG. 4) that is testable and programmable where an input signal is linearly delayed. Fine delay element 410 differs from fine delay element 110 (FIGS. 1 and 2) by inserting a NAND gate 502 coupled to receive a test signal and the signal received by the sf terminal, i.e., dly_sel<1>. Furthermore, fine delay element 410 differs from fine delay element 110 by comprising transistor 503 to prevent a floating node and inverter 501. It is noted that fine delay element 410 may comprise any number of transmission gates, inverters, dummy loads and logic gates. It is further noted that there are other embodiments of fine delay element 410 where fine adjustments are applied to the delay of the input signal. It is further noted that all other aspects of fine delay element 410 are identical to fine delay element 110.

Referring to FIG. 5, the problem of inverter 224 driving the data bus, zr, without being affected by whether transmission gate 235 is activated or not is solved differently than fine delay element 110. During the test mode, i.e., test signal is asserted, fine delay element 410 is tested for faults, e.g., stuck-at-faults. During the functional mode, i.e., test signal is desserts, inverter 224 drives the data path, zr. When inverter 224 drives the data path, zr, in functional mode, inverter 224 is not affected by whether transmission gate 235 is activated or not because the test path is disconnected during functional mode, i.e., test signal is deasserted. By disconnecting the test path, power dissipation is reduced. Therefore, by disconnecting the test path during functional mode, fine delay element 410 generates linear delay steps with less power than fine delay element 110.

Figure 6:
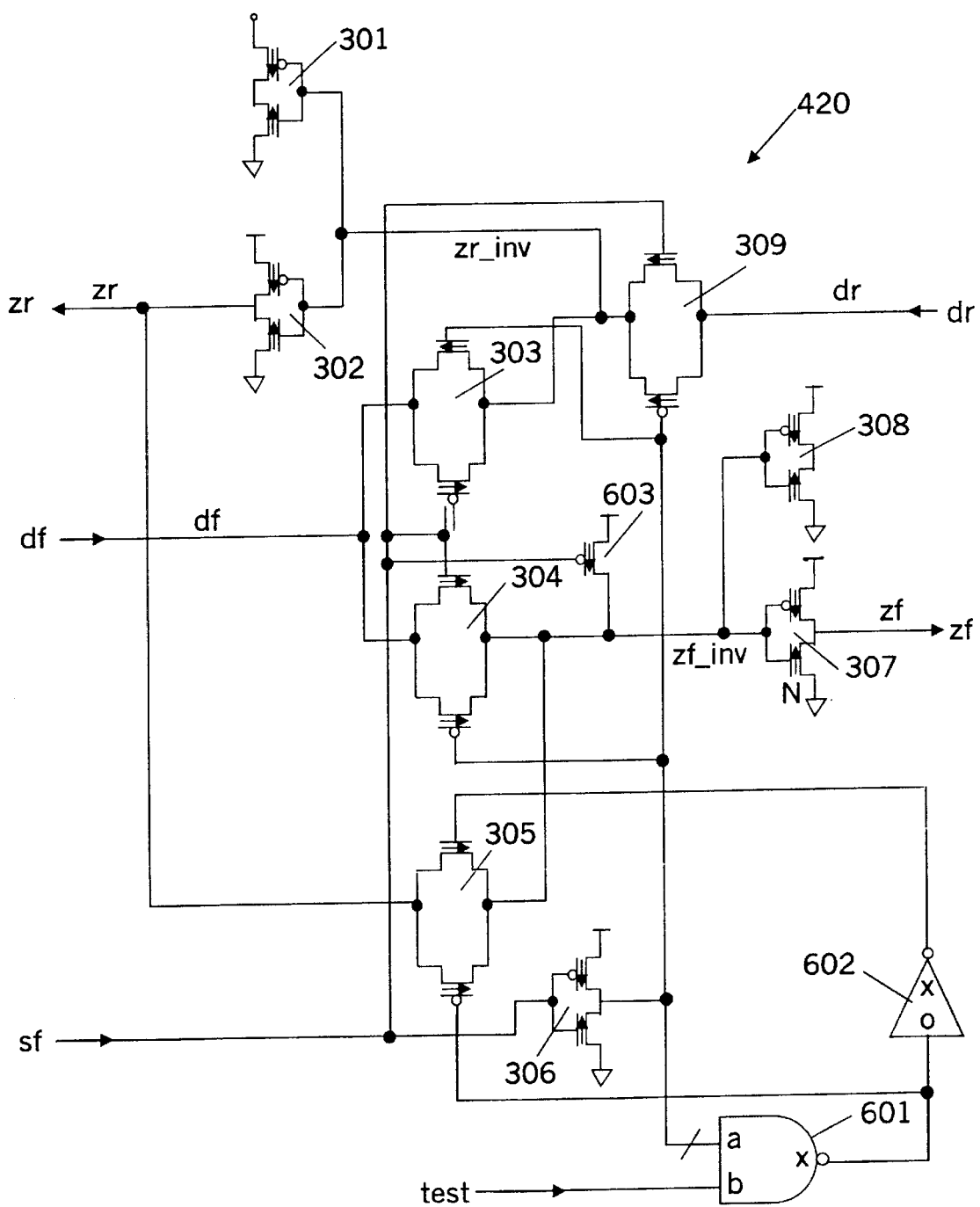
FIG. 6 illustrates another embodiment of the present invention of a course delay element linearly delaying a signal with testing and programming capability.

FIG. 6—Another Embodiment of a Course Delay Element Linearly Delaying a Signal

FIG. 6 illustrates an embodiment of course delay element 420 (FIG. 4) that is testable and programmable where an input signal is linearly delayed. It is noted that course delay elements 420 are identical and therefore the embodiment of FIG. 6 applies to each course delay element 420. Course delay element 420 differs from course delay element 120 (FIGS. 1 and 3) by inserting a NAND gate 601 coupled to receive a test signal and the signal received by the sf terminal of that respective course delay element 420, e.g., course delay element 420A receives dly_sel<2> at its sf terminal. Furthermore, course delay element 420 differs from course delay element 120 by comprising transistor 603 to prevent a floating node and inverter 602. It is noted that course delay element 420 may comprise any number of transmission gates, inverters, dummy loads and logic gates. It is further noted that there are other embodiments of course delay element 420 where course adjustments are applied to the delay of the input signal. It is further noted that all other aspects of course delay element 420 are identical to course delay element 120.

Referring to FIG. 6, the problem of inverter 302 driving the data bus, zr, without being affected by whether transmission gate 305 is activated or not is solved differently than course delay element 120. During the test mode, i.e., test signal is asserted, course delay element 420 is tested for faults, e.g., stuck-at-faults During the functional mode, i.e., test signal is deasserted, inverter 302 drives the data path, zr. When inverter 302 drives the data path, zr, in functional mode, inverter 302 is not affected by whether transmission gate 305 is activated or not because the test path is disconnected during functional mode, i.e., test signal is deasserted. By disconnecting the test path, power dissipation is reduced. Therefore, by disconnecting the test path during functional mode, course delay element 420 generates linear delay steps with less power than course delay element 120.

Figure 7:
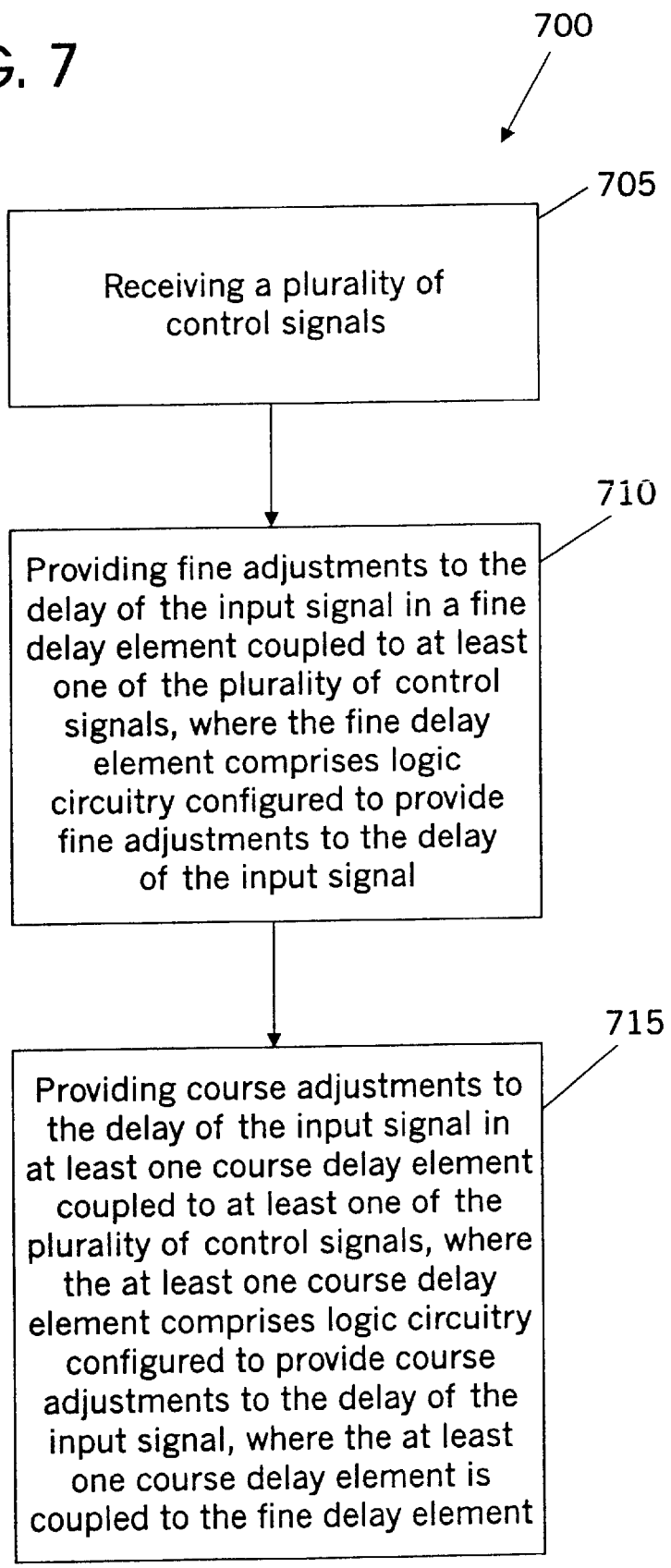
FIG. 7 is a flowchart depicting a method for linearly delaying a signal with testing and programming capability.

FIG. 7—Flowchart of a Method for Linearly Delaying a Signal

FIG. 7 illustrates a method 700 according to an embodiment of the present invention. FIG. 7 is a method 700 for linearly delaying an input signal. In step 705, the linear delay element receives a plurality of control signals. In one embodiment, fine delay element 110 (FIGS. 1 and 2) of linear delay element 100 (FIG. 1) receives a plurality of control signals, e.g., super, dly_sel<0>, dly_sel<1> at terminals s0, s1, sf, respectively. In another embodiment, fine delay element 410 (FIGS. 4 an 5) of linear delay element 400 (FIG. 4) receives a plurality of control signals, e.g., dly_sel<0>, dly_sel<1>, in addition to receiving a test signal to determine if there exists any faults at linear delay element 410. In another embodiment, all but the last course delay element 120 (FIGS. 1 and 3) of linear delay element 100 (none if there exists only one course delay element 120) receives a control signal that determines whether the input signal is to be propagated to the next course delay element 120. In another embodiment, each course delay element 420 (FIGS. 4 and 6) of linear delay element 400 receives a test signal to determine if there exists any faults at the respective course delay element 420.

In step 710, fine adjustments are provided to the input signal through the logic circuitry of fine delay element 110 and 410. For example, adjustments may be made by adjusting the load of at least one particular dummy load and/or adjusting the size of at least one channel widths of at least one particular inverter and/or at least one particular transmission gate without affecting the driveability of the data path.

In step 715, course adjustments are provided to the input signal through the logic circuitry of course delay element(s) 120 and 420. Course delay element(s) 120 and 420 is (are) coupled to at least one control signal. In another embodiment, course delay element(s) 120 and 420 is (are) also coupled to a test signal to determine if there exists any faults at the respective course delay element(s) 120 and 420. Course adjustments may be made by adjusting the load of at least one particular dummy load and/or adjusting the size of at least one channel widths of at least one particular inverter and/or at least one particular transmission gate without affecting the driveability of the data path.

Fine delay element 110 and 410 and course delay element(s) 120 and 420 are configured to provide testability and programmability. Furthermore, fine delay element 110 and 410 and course delay element(s) are configured to provide linear delay steps.

Although the method and circuitry of the present invention is described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims. It is noted that the headings are used only for organizational purposes and not meant to limit the scope of the description or claims.

What is claimed is:

1. Circuitry in an integrated circuit for linearly delaying a signal comprising:
    a plurality of control signals;
    a fine delay element coupled to at least one of said plurality of control signals, wherein said fine delay element comprises logic circuitry configured to provide fine adjustments to the delay of said signal,
    at least one course delay element coupled to said fine delay element, wherein said at least one course delay element is coupled to at least one of said plurality of control signals, wherein said at least one course delay element comprises logic circuitry configured to provide course adjustments to the delay of said signal;
    wherein said fine delay element and said at least one course delay element are configured to provide linear delay steps; and
    wherein said logic circuitry of said fine delay element and said at least one course delay element each comprise a plurality of transmission gates, a plurality of inverters and at least one dummy load.

2. The circuitry as recited in claim 1, wherein said linear delay steps are adjusted by adjusting the size of at least one channel width of at least one particular inverter of said plurality of inverters of said fine delay element.

3. The circuitry as recited in claim 2, wherein said adjusting the size of at least one channel width of at least one particular inverter of said plurality of inverters of said fine delay element is accomplished without affecting the driveability of the data path.

4. The circuitry as recited in claim 1, wherein said linear delay steps are adjusted by adjusting the size of at least one channel width of at least one particular inverter of said plurality of inverters of said at least one course delay element.

5. The circuitry as recited in claim 4, wherein said adjusting the size of at least one channel width of at least one particular inverter of said plurality of inverters of said at least one course delay element is accomplished without affecting the driveability of the data path.

6. The circuitry as recited in claim 1, wherein said linear delay steps are adjusted by adjusting the size of at least one channel width of at least one particular transmission gate of said plurality of transmission gates of said fine delay element.

7. The circuitry as recited in claim 1, wherein said linear delay steps are adjusted by adjusting the size of at least one channel width of at least one particular transmission gate of said plurality of transmission gates of said at least one course delay element.

8. The circuitry as recited in claim 1, wherein said linear delay steps are adjusted by adjusting the load of at least one particular dummy load of said at least one dummy load of said fine delay element.

9. The circuitry as recited in claim 1, wherein said linear delay steps are adjusted by adjusting the load of at least one particular dummy load of said at least one dummy load of said at least one course delay element.

10. The circuitry as recited in claim 1, wherein one of said plurality of inverters in said fine delay element and said at least one course delay element drives the data path independent of the operation of a test path.

11. The circuitry as recited in claim 1, wherein one of said plurality of inverters in said fine delay element and said at least one course delay element connects a test path, wherein said test path is used to detect faults at said fine delay element and said at least one course delay element.

12. Circuitry in an integrated circuit for linearly delaying a signal comprising:

a plurality of control signals;

a fine delay element coupled to at least one of said plurality of control signals, wherein said fine delay element comprises logic circuitry configured to provide fine adjustments to the delay of said signal, at least one course delay element coupled to said fine delay element, wherein said at least one course delay element is coupled to at least one of said plurality of control signals, wherein said at least one course delay element comprises logic circuitry configured to provide course adjustments to the delay of said signal;

wherein said fine delay element and said at least one course delay element are configured to provide linear delay steps; and wherein said fine delay element and said at least one course delay element comprise a plurality of selectable propagation paths, wherein said plurality of selectable propagation paths are linear in delay with respect to one another.

13. Circuitry in an integrated circuit for linearly delaying a signal comprising:

a plurality of control signals;

a fine delay element coupled to at least one of said plurality of control signals, wherein said fine delay element comprises logic circuitry configured to provide fine adjustments to the delay of said signal, at least one course delay element coupled to said fine delay element, wherein said at least one course delay element is coupled to at least one of said plurality of control signals, wherein said at least one course delay element comprises logic circuitry configured to provide course adjustments to the delay of said signal;

wherein said file delay element and said at least one course delay element are configured to provide linear delay steps; and wherein said fine delay element and said at least one course delay element are coupled in a manner where a signal propagates from said fine delay element to said at least one course delay element and back to said fine delay element.

14. Circuitry in an integrated circuit for linearly delaying a signal comprising:

a plurality of control signals;

a fine delay element coupled to at least one of said plurality of control signals, wherein said fine delay element comprises logic circuitry configured to provide fine adjustments to the delay of said signal, at least one course delay element coupled to said fine delay element, wherein said at least one course delay element is coupled to at least one of said plurality of control signals, wherein said at least one course delay element comprises logic circuitry configured to provide course adjustments to the delay of said signal;

wherein said fine delay element and said at least one course delay element are configured to provide linear delay steps; and wherein a test signal is coupled to said fine delay element and to each of said at least one course delay element, wherein said test signal is used to detects faults at said fine delay element and each of said at least one course delay element.

15. The circuitry as recited in claim 14, wherein said logic circuitry of said fine delay element and said at least one course delay element each comprise a plurality of transmission gates, a plurality of inverters, at least one dummy load and at least one logic gate.

16. The circuitry as recited in claim 15, wherein said at least one logic gate in said fine delay element and said at least one course delay element receives said test signal.

17. The circuitry as recited in claim 15, wherein a particular inverter of one of said plurality of inverters of said fine delay element and said at least one course delay element drives the data path in functional mode, wherein said test signal is deasserted during functional mode, wherein a test path is disconnected during functional mode, wherein by disconnecting said test path during functional mode power is reduced.

18. The circuitry as recited in claim 14, wherein each of said at least one course delay element comprises:

an input coupled to a first and a second transmission gate;

a third transmission gate coupled to said first transmission gate;

a first and second inverter coupled to said second transmission gate;

a third and fourth inverter coupled to said first transmission gate, wherein said third inverter connects a test path, wherein said fourth inverter drives a data path;

a fourth transmission gate coupled to said fourth inverter;

an output to a prior delay element coupled to said fourth inverter;

a fifth inverter coupled to said third transmission gate; and a first logic gate coupled to receive said test signal, wherein an output of said logic gate is coupled to said fourth transmission gate.

19. The circuitry as recited in claim 14, wherein said fine delay element comprises:

a first, a second and a third inverter coupled to receive an input signal;

a first transmission gate coupled to said first inverter;

a second transmission gate coupled to said second inverter;

a fourth, a fifth and a sixth inverter coupled to said third inverter;

a third and fourth transmission gate coupled to said fourth inverter;

a seventh inverter coupled to said third and fourth transmission gate;

a fifth and a sixth transmission gate coupled to said first and second transmission gate;

a seventh and an eighth transmission gate coupled to said seventh inverter;

an eighth inverter coupled to said fifth transmission gate, wherein said eighth inverter drives a data path;

an output coupled to said eighth inverter;

a ninth transmission gate coupled to said eighth inverter, wherein said ninth transmission gate is coupled to receive said input signal from a subsequent delay element;

a ninth inverter coupled to said sixth and eighth transmission gate, wherein said ninth inverter outputs said input signal to said subsequent delay element;

a tenth transmission gate coupled to said output;

a tenth inverter coupled to said tenth transmission gate;

an eleventh inverter coupled to said ninth transmission gate;

a twelfth inverter coupled to said eighth inverter, wherein said twelfth inverter connects a test path; and a first logic gate coupled to receive said test signal, wherein an output of said logic gate is coupled to said tenth transmission gate.

20. Circuitry in an integrated circuit for linearly delaying a signal comprising:

a plurality of control signals;

a fine delay element coupled to at least one of said plurality of control signals, wherein said fine delay element comprises logic circuitry configured to provide fine adjustments to the delay of said signal, at least one course delay element coupled to said fine delay element, wherein said at least one course delay element is coupled to at least one of said plurality of control signals, wherein said at least one course delay element comprises logic circuitry configured to provide course adjustments to the delay of said signal;

wherein said fine delay element and said at least one course delay element are configured to provide linear delay steps; and wherein each of said at least one course delay element comprises:

an input coupled to a first and a second transmission gate;

a third transmission gate coupled to said first transmission gate;

a first and second inverter coupled to said second transmission gate;

a third and fourth inverter coupled to said first transmission gate, wherein said third inverter connects a test path, wherein said fourth inverter drives a data path;

a fourth transmission gate coupled to said third inverter;

an output to a prior delay element coupled to said fourth inverter; and a fifth inverter coupled to said fourth transmission gate.

21. Circuitry in an integrated circuit for linearly delaying a signal comprising:

a plurality of control signals;

a fine delay element coupled to at least one of said plurality of control signals, wherein said fine delay element comprises logic circuitry configured to provide fine adjustments to the delay of said signal, at least one course delay element coupled to said fine delay element, wherein said at least one course delay element is coupled to at least one of said plurality of control signals, wherein said at least one course delay element comprises logic circuitry configured to provide course adjustments to the delay of said signal;

wherein said fine delay element and said at least one course delay element are configured to provide linear delay steps; and wherein said fine delay element comprises:

a first, a second and a third inverter coupled to receive an input signal;

a first transmission gate coupled to said first inverter;

a second transmission gate coupled to said second inverter;

a fourth, a fifth and a sixth inverter coupled to said third inverter;

a third and fourth transmission gate coupled to said fourth inverter;

a seventh inverter coupled to said third and fourth transmission gate;

a fifth and a sixth transmission gate coupled to said first and second transmission gate;

a seventh and an eighth transmission gate coupled to said seventh inverter;

an eighth inverter coupled to said fifth transmission gate, wherein said eighth inverter drives a data path;

an output coupled to said eighth inserter;

a ninth transmission gate coupled to said eighth inverter, wherein said ninth transmission gate is coupled to receive said input signal from a subsequent delay element;

a ninth inverter coupled to said sixth and eighth transmission gate, wherein said ninth inverter outputs said input signal to said subsequent delay element;

a tenth transmission gate coupled to said output;

a tenth inverter coupled to said tenth transmission gate;

an eleventh inverter coupled to said ninth transmission gate; and a twelfth inverter coupled to said eighth inverter, wherein said twelfth inverter connects a test path.

22. A method for linearly delaying a signal in an integrated circuit comprising the steps of:

receiving a plurality of control signals;

providing fine adjustments to the delay of said signal in a fine delay element coupled to at least one of said plurality of control signals, wherein said fine delay element comprises logic circuitry configured to provide fine adjustments to the delay of said signal;

providing course adjustments to the delay of said signal in at least one course delay element coupled to at least one of said plurality of control signals, wherein said at least one course delay element comprises logic circuitry configured to provide course adjustments to the delay of said signal, wherein said at least one course delay element is coupled to said fine delay element;

wherein said fine delay element and said at least one course delay element are configured to provide linear delay steps; and wherein said logic circuitry of said fine delay element and said at least one course delay element each comprise a plurality of transmission gates, a plurality of inverters and at least one dummy load.

23. The method as recited in claim 22, wherein said linear delay steps are adjusted by adjusting the size of at least one channel width of at least one particular inverter of said plurality of inverters of said fine delay element.

24. The method as recited in claim 23, wherein said adjusting the size of at least one channel width of at least one particular inverter of said plurality of inverters of said fine delay element is accomplished without affecting the driveability of the data path.

25. The method as recited in claim 22, wherein said linear delay steps are adjusted by adjusting the size of at least one channel width of at least one particular inverter of said plurality of inverters of said at least one course delay element.

26. The method as recited in claim 25, wherein said adjusting the size of at least one channel width of at least one particular inverter of said plurality of inverters of said at least one course delay element is accomplished without affecting the driveability of the data path.

27. The method as recited in claim 22, wherein said linear delay steps are adjusted by adjusting the size of at least one channel width of at least one particular transmission gate of said plurality of transmission gates of said fine delay element.

28. The method as recited in claim 22, wherein said linear delay steps are adjusted by adjusting the size of at least one channel width of at least one particular transmission gate of said plurality of transmission gates of said at least one course delay element.

29. The method as recited in claim 22, wherein said linear delay steps are adjusted by adjusting the load of at least one particular dummy load of said at least one dummy load of said fine delay element.

30. The method as recited in claim 22, wherein said linear delay steps are adjusted by adjusting the load of at least one particular dummy load of said at least one dummy load of said at least one course delay element.

31. The method as recited in claim 22, wherein one of said plurality of inverters in said fine delay element and said at least one course delay element drives the data path independent of the operation of a test path.

32. The method as recited in claim 22, wherein one of said plurality of inverters in said fine delay element and said at least one course delay element connects a test path, wherein said test path is used to detect faults at said fine delay element and said at least one course delay element.

33. A method for linearly delaying a signal in an integrated circuit comprising the steps of:
receiving a plurality of control signals;
providing fine adjustments to the delay of said signal in a fine delay element coupled to at least one of said plurality of control signals, wherein said fine delay element comprises logic circuitry configured to provide fine adjustments to the delay of said signal;
providing course adjustments to the delay of said signal in at least one course delay element coupled to at least one of said plurality of control signals, wherein said at least one course delay element comprises logic circuitry configured to provide course adjustments to the delay of said signal, wherein said at least one course delay element is coupled to said fine delay element;
wherein said fine delay element and said at least one course delay element are configured to provide linear delay steps; and
wherein said fine delay element and said at least one course delay element comprises a plurality of selectable propagation paths, wherein said plurality of selectable propagation paths are linear in delay with respect to one another.

34. A method for linearly delaying a signal in an integrated circuit comprising the steps of:
receiving a plurality of control signals;
providing fine adjustments to the delay of said signal in a fine delay element coupled to at least one of said plurality of control signals, wherein said fine delay element comprises logic circuitry configured to provide fine adjustments to the delay of said signal;
providing course adjustments to the delay of said signal in at least one course delay element coupled to at least one of said plurality of control signals, wherein said at least one course delay element comprises logic circuitry configured to provide course adjustments to the delay of said signal, wherein said at least one course delay element is coupled to said fine delay element;
wherein said fine delay element and said at least one course delay element are configured to provide linear delay steps; and wherein said fine delay element and said at least one course delay element are coupled in a manner where a signal propagates from said fine delay element to said at one course delay element and back to said fine delay element.

35. A method for linearly delaying a signal in an integrated circuit comprising the steps of:
receiving a plurality of control signals;
providing fine adjustments to the delay of said signal in a fine delay element coupled to at least one of said plurality of control signals, wherein said fine delay element comprises logic circuitry configured to provide fine adjustments to the delay of said signal;
providing course adjustments to the delay of said signal in at least one course delay element coupled to at least one of said plurality of control signals, wherein said at least one course delay element comprises logic circuitry configured to provide course adjustments to the delay of said signal, wherein said at least one course delay element is coupled to said fine delay element;
wherein said fine delay element and said at least one course delay element are configured to provide linear delay steps; and
wherein a test signal is coupled to said fine delay element and to each of said at least one course delay element, wherein said test signal is used to detects faults at said fine delay element and each of said at least one course delay element.

36. The method as recited in claim 35, wherein said logic circuitry of said fine delay element and said at least one course delay element each comprise a plurality of transmission gates, a plurality of inverters, at least one dummy load and at least one logic gate.

37. The method as recited in claim 36, wherein said at least one logic gate in said fine delay element and said at least one course delay element receives said test signal.

38. The method as recited in claim 36, wherein a particular inverter of one of said plurality of inverters of said fine delay element and said at least one course delay element drives the data path in functional mode, wherein said test signal is deasserted during functional mode, wherein a test path is disconnected during functional mode, wherein by disconnecting said test path during function mode power is reduced.

39. The method as recited in claim 35, wherein each of said at least one course delay element comprises:
an input coupled to a first and a second transmission gate;
a third transmission gate coupled to said first transmission gate;
a first and second inverter coupled to said second transmission gate;
a third and fourth inverter coupled to said first transmission gate, wherein said third inverter connects a test path, wherein said fourth inverter drives a data path;
a fourth transmission gate coupled to said fourth inverter;
an output to a prior delay element coupled to said fourth inverter;
a fifth inverter coupled to said third transmission gate; and
a first logic gate coupled to receive said test signal, wherein an output of said logic gate is coupled to said fourth transmission gate.

40. The method as recited in claim 35, wherein said fine delay element comprises:
a first, a second and a third inverter coupled to receive an input signal;

a first transmission gate coupled to said first inverter;
a second transmission gate coupled to said second inverter;
a fourth, a fifth and a sixth inverter coupled to said third inverter;
a third and fourth transmission gate coupled to said fourth inverter;
a seventh inverter coupled to said third and fourth transmission gate;
a fifth and a sixth transmission gate coupled to said first and second transmission gate;
a seventh and an eighth transmission gate coupled to said seventh inverter;
an eighth inverter coupled to said fifth transmission gate, wherein said eighth inverter drives a data path;
an output coupled to said eighth inverter;
a ninth transmission gate coupled to said eighth inverter, wherein said ninth transmission gate is coupled to receive said input signal from a subsequent delay element;
a ninth inverter coupled to said sixth and eighth transmission gate, wherein said ninth inverter outputs said input signal to said subsequent delay element;
a tenth transmission gate coupled to said output;
a tenth inverter coupled to said tenth transmission gate;
an eleventh inverter coupled to said ninth transmission gate;
a twelfth inverter coupled to said eighth inverter, wherein said twelfth inverter connects a test path; and
a first logic gate coupled to receive said test signal, wherein an output of said logic gate is coupled to said tenth transmission gate.

41. A method for linearly delaying a signal in an integrated circuit comprising the steps of:
receiving a plurality of control signals;
providing fine adjustments to the delay of said signal in a fine delay element coupled to at least one of said plurality of control signals, wherein said fine delay element comprises logic circuitry configured to provide fine adjustments to the delay of said signal;
providing course adjustments to the delay of said signal in at least one course delay element coupled to at least one of said plurality of control signals, wherein said at least one course delay element comprises logic circuitry configured to provide course adjustments to the delay of said signal, wherein said at least one course delay element is coupled to said fine delay element;
wherein said fine delay element and said at least one course delay element are configured to provide linear delay steps; and
wherein each of said at least one course delay element comprises:
an input coupled to a first and a second transmission gate;
a third transmission gate coupled to said first transmission gate;
a first and second inverter coupled to said second transmission gate;
a third and fourth inverter coupled to said first transmission gate, wherein said third inverter connects a test path, wherein said fourth inverter drives a data path;
a fourth transmission gate coupled to said third inverter;
an output to a prior delay element coupled to said fourth inverter; and
a fifth inverter coupled to said fourth transmission gate.

42. A method for linearly delaying a signal in an integrated circuit comprising the steps of:
receiving a plurality of control signals;
providing fine adjustments to the delay of said signal in a fine delay element coupled to at least one of said plurality of control signals, wherein said fine delay element comprises logic circuitry configured to provide fine adjustments to the delay of said signal;
providing course adjustments to the delay of said signal in at least one course delay element coupled to at least one of said plurality of control signals, wherein said at least one course delay element comprises logic circuitry configured to provide course adjustments to the delay of said signal, wherein said at least one course delay element is coupled to said fine delay element;
wherein said fine delay element and said at least one course delay element are configured to provide linear delay steps; and
wherein said fine delay element comprises:
a first, a second and a third inverter coupled to receive an input signal;
a first transmission gate coupled to said first inverter;
a second transmission gate coupled to said second inverter;
a fourth a fifth and a sixth inverter coupled to said third inverter;
a third and fourth transmission gate coupled to said fourth inverter;
a seventh inverter coupled to said third and fourth transmission gate;
a fifth and a sixth transmission ate coupled to said first and second transmission gate;
a seventh and an eighth transmission gate coupled to said seventh inverter;
an eighth inverter coupled to said fifth transmission gate, wherein said eighth inserter drives a data path;
an output coupled to said eighth inverter;
ninth transmission gate coupled to said eighth inverter, wherein said ninth transmission gate is coupled to receive said input signal from a subsequent delay element;
a ninth inverter coupled to said sixth and eighth transmission gate, wherein said ninth inverter outputs said input signal to said subsequent delay element;
a tenth transmission gate coupled to said output;
a tenth inverter coupled to said tenth Transmission gate;
an eleventh inverter coupled to said ninth transmission gate; and
a twelfth inverter coupled to said eighth inverter, wherein said twelfth inverter connects a test path.

* * * * *

UNITED STATES PATENT AND TRADEMARK OFFICE
CERTIFICATE OF CORRECTION

PATENT NO. : 6,546,530 B1
DATED : April 8, 2003
INVENTOR(S) : Daniel Mark Dreps, Frank David Ferraiolo and Jing Fang Hao It is certified that error appears in the above-identified patent and that said Letters Patent is hereby corrected as shown below:

<u>Column 13,</u>
Line 38, please replace "file" with -- fine --.

<u>Column 20,</u>
Line 34, following "fourth" please insert -- , --.
Line 47, before "ninth" please insert -- a --.
Line 55, please replace "Transmission" with -- transmission --.

Signed and Sealed this

Ninth Day of March, 2004

JON W. DUDAS
*Acting Director of the United States Patent and Trademark Office*